US005399960A

United States Patent [19]

Gross

[11] Patent Number: 5,399,960

[45] Date of Patent: Mar. 21, 1995

[54] REFERENCE VOLTAGE GENERATION METHOD AND APPARATUS

[75] Inventor: Eric Gross, Colorado Springs, Colo.

[73] Assignee: Cypress Semiconductor Corporation, San Jose, Calif.

[21] Appl. No.: 151,415

[22] Filed: Nov. 12, 1993

[51] Int. Cl.$^6$ .......................... G05F 3/16; H03K 3/01

[52] U.S. Cl. .................................... 323/313; 327/541; 327/513

[58] Field of Search ............... 323/312, 313, 314, 315; 307/296.1, 296.6

[56] References Cited

U.S. PATENT DOCUMENTS

| | | | |
|---|---|---|---|
| 4,723,108 | 2/1988 | Murphy et al. | 323/315 |
| 4,769,589 | 9/1988 | Rosenthal | 323/313 |
| 5,208,527 | 5/1993 | Poletto et al. | 323/313 |
| 5,212,440 | 5/1993 | Waller | 323/313 |
| 5,245,273 | 9/1993 | Greaves et al. | 323/313 |
| 5,252,909 | 10/1993 | Aizaki | 323/313 |

*Primary Examiner*—Steven L. Stephan
*Assistant Examiner*—Matthew Nguyen
*Attorney, Agent, or Firm*—Blakely, Sokoloff, Taylor & Zafman

[57] ABSTRACT

An adaptive active filtering method and apparatus that detects changes in noise conditions and reduces the signal propagation speed as noise conditions worsen. This active filter has a level shifting inverter, which inverts the input signal and converts the logic levels of the input signal into chip logic levels. This inverted input signal is presented at the input of a driver inverter, which once again inverts the signal. This second inversion filters out input noise, because a voltage controlled device (which is attached to the driver inverter) reduces the switching speed of this inverter as the noise condition worsen; this reduction in switching speed reduces the propagation speed and thus filters out noise. In addition, two cascaded voltage generator circuits create a reference voltage generator, that enables the voltage controlled device to detect changes in noise conditions, by providing it with a reference voltage that varies in a controlled and specific manner with the changes in transistor conductance parameters, power supply voltages, and operating temperatures. This reference voltage generator controls the variance of the reference voltage in two manners. First, this generator utilizes a positive temperature coefficient floating voltage source to increase (in a controlled fashion) the variance of the reference voltage with changes in the temperature. Second, this generator uses a feedback path, between the first and the second voltage generator circuits, to compensate for uncontrolled variations of the reference voltage due to process variations in transistor conductance parameters.

14 Claims, 15 Drawing Sheets

REFERENCE VOLTAGE GENERATION METHOD AND APPARATUS

BACKGROUND OF THE INVENTION

1. Field of the Invention

This invention relates to the field of integrated circuits and, in particular, to input buffers and reference circuits for integrated circuits. The invention consists of an adaptive active filtering method and apparatus that detects changes in noise conditions and reduces the active signal propagation speed as the noise conditions worsen. In addition, this filter uses a reference voltage generator which permits the circuit operation to be stabilized, when used in conjunction with other circuit elements that are normally used in the construction of functional circuits, by producing a reference voltage that varies in a controlled and specific fashion with changes in the noise conditions.

2. Background Art

Variations in MOS transistor conductance parameters, power supply voltages, and operating temperatures can increase or decrease the incidence of on-chip generated noise. Cold temperatures, high power supply voltages (i.e. $V_{CC}$), and high transistor conductance parameters (i.e. fast transistors), are factors that lead to a high incidence of on-chip generated noise. Conversely, low noise conditions (i.e. high temperatures, low power supply voltages, and slow transistors) are conditions that are less conducive to an appreciable generation of noise.

On-chip generated noise is a major source of concern in the design of fast multi-output chips. For example, in the case of random access memories (i.e. RAMs), the simultaneous firing of the output drive transistors can generate a sufficiently large noise spike on the internal power supply busses to force the RAM to detect an incorrect address state, to write to the wrong memory cell, or to cause an access pushout while trying to recover the correct data state.

FIG. 1 shows one typical prior art input buffer consisting of a passive resistor and capacitor (RC) filter network. This prior art RC input buffer 1 is deficient in that the RC circuit requires substantial layout area and has a tendency to make the device performance a function of the input slew rate. Also, this filter is problematic because it cannot distinguish high on-chip noise conditions from low on-chip noise conditions (i.e. it is not an adaptive filter). Ideally, when high noise conditions are not present, an input noise filter should not have any effect on the device performance. However, since this filter is not adaptive, it performs the same delaying function irrespective of the probability of occurrence of on-chip generated noise. Consequently, during low noise conditions, this filter unnecessarily slows down the speed of the device.

A second prior art input buffer is shown in FIG. 2. This Schmitt-type positive feedback circuit configuration filters out input noise by introducing hysteresis in the signal path. Unfortunately, just as with the passive RC network of FIG. 1, the input buffer with hysteresis cannot distinguish between high and low noise conditions. Consequently, this buffer also adds a constant delay to the signal propagation path, since its filtering function is not modulated during low noise conditions.

In addition to the prior art input buffer noise control techniques, a second area of prior art is pertinent to the present invention. This area is the field of reference voltage generators, and FIG. 3 shows one prior art reference voltage generator. (A detailed description of this prior art generator is provided in U.S. Pat. No. 4,723,108 issued to Murphy et al., and this description is incorporated in this application by reference.) This reference voltage generator 3 consists of two cascaded voltage generator circuits 4 and 6, which use current control means (i.e. the current mirrors formed by transistors 10, 16, 12, and 8, and 22, 30, 20 and 26) to establish their respective output voltages (i.e. the voltages at nodes 14 and 28). The reference voltage that this generator produces is the output voltage 28 of the second voltage generator circuit 6.

Ideally, the generated noise filter reference voltage varies in a specific and controlled fashion with the changes in noise conditions. More specifically, the reference voltage characteristic curve (i.e. a curve that, for a specific operating temperature and transistor conductance parameters, shows the changes in the reference voltage with the changes in the power supply voltage) ideally consists of the following three parts: (1) a first linear voltage level corresponding to low noise conditions (in this embodiment, a low level); (2) a second linear voltage level corresponding to high noise conditions (in this embodiment, a high level); and (3) a knee (i.e., a region of maximum curvature) within the device operating range corresponding to intermediate noise conditions. The reference voltage's variance with noise conditions is controlled such that the characteristic curves vary in a controlled fashion with changes in transistor conductance parameters, operating temperatures, and supply voltage, in order to adequately track changes in the noise conditions.

Because of two reasons, prior art generator 3 of FIG. 3 does not always produce a reference voltage with the desired characteristics. First, this circuit's reference voltage characteristics do not vary substantially with respect to changes in on-chip noise conditions as a function of temperature. The use of temperature sensitive resistors 18 and 32 will further act to remove the desired temperature variance from the reference circuit's output. Temperature sensitive resistors are typically used: (1) since, in order to conserve layout area, the use of high sheet resistance materials is required, and (2) since, in order to insure accurate circuit operations, the resistors should not deviate more than 15% about their nominal value. Metal resistors require too large a layout area, polysilicon resistors do not have the required tolerance control, and doped well resistors vary greatly with biasing deviations. On the other hand, diffusion resistors meet both the resistance and tolerance constraints; however, they are temperature sensitive.

Diffusion resistors and transistors both have a positive temperature coefficients, which negate substantial temperature variation of the reference voltage since the resistance tracks in the same direction as the transistor channel on resistance. Consequently, as FIG. 4 shows, the circuit presented in FIG. 3 produces reference voltage characteristic curves which do not sufficiently vary with respect to changes in the temperature. In other words, this prior art reference voltage generator does not adequately respond to temperature variations in the amount of on-chip generated noise.

Second, due to variation between the NMOS and PMOS transistor conductance parameters (i.e. process variations), the circuit presented in FIG. 3 suffers from significant destabilization of the desired reference voltage characteristics. These process variations create different permutations of CMOS technology, of which a few are: (1) typical PMOS transistors and typical NMOS transistors (i.e. TT process); (2) fast PMOS transistors and fast NMOS transistors (i.e. FF process); (3) fast PMOS transistors and slow NMOS transistors (i.e. FS process); (4) slow PMOS transistors and fast NMOS transistors (i.e. SF process); and (5) slow PMOS transistors and slow NMOS transistors (i.e. SS process).

Whenever the generator of FIG. 3 comprises non-typical transistors, the reference voltage characteristic curves do not vary in the desired specific and controlled fashion with the changes in noise conditions. The characteristic curves are non-ideal because variations in transistor conductance parameters change the node voltages in the two cascaded voltage generator circuits. Node 14 in FIG. 3 serves as a good example to demonstrate this change in node voltages. If typical CMOS (i.e. TT process) transistors are used, the node voltage at 14 is at its nominally designed value. However, if non-typical CMOS transistors are used, the voltage at node 14 differs from its optimum level. For example, if slow P-channels and fast N-channels (SF process corner) are used, the voltage at node 14 will be lower than its nominally designed value. This node voltage will be pulled down, because the channel resistance of NMOS transistor 16 is less than the channel resistance of PMOS transistor 12. This voltage level decrease at the output of the first voltage generator circuit, in turn causes a voltage level decrease at the output of the second voltage generator circuit. The output of the second voltage generator circuit decreases because the reduced voltage at node 14 increases the drive of PMOS transistor 20 (i.e. increases $V_{GS}$) which in turn strengthens the NMOS transistor 30. In addition, a second pull down occurs at the output of the second voltage generator circuit (i.e. at node 28), since the channel resistance of NMOS transistor 30 has decreased with respect to the channel resistance of PMOS transistors 24 and 26. Thus, the voltage at the output of the second voltage generator circuit is pulled below its nominal value (i.e. the output voltage when typical-typical transistors are used).

Finally, FIG. 5 shows the characteristic curves of the prior art reference voltage generator for varying values of transistor conductance skew; it should be noted that, in order to best show the destabilization of the reference voltage due to process variations, temperature insensitive resistors were used. As it can be seen from these curves, the variations in transistor conductance parameters will destabilize the location of the characteristic curve's knee (i.e. region of maximum curvature). The high operating temperature, slow P-channel, slow N-channel (SS process corner) curve presents one example of this generator's undesirable output voltage characteristics, since this curve does not have a knee within the device operating range.

SUMMARY OF THE INVENTION

It is an object of the present invention to provide a filtering method and apparatus whose buffering function is dependent on the noise conditions. Another object of the present invention is to provide a reference voltage generator which does not suffer from uncontrolled variations in the reference voltage due to process variations. Yet another object of the present invention is to generate a reference voltage that varies in a controlled and specific fashion with changes in operating temperature and supply voltage.

These and other objects of the present invention are accomplished by an adaptive active filtering method and apparatus that detects changes in noise conditions and reduces the signal propagation speed as noise conditions worsen. Device performance is not impacted when noise conditions worsen since the device is operating at its fastest, and device performance is improved when the device is operating slower and the on-chip generated noise is less. The filter is invisible to the signal deselection path.

This active filter has four functional blocks. The first functional block is a level shifting inverter that has two terminals. The first terminal is the input, which serves as the input of the buffer circuitry containing the active filter. The second terminal is the output terminal, where an inverted version of the input signal appears; in addition, at the output terminal, the logic levels of the input signal have been converted into chip logic levels. The second functional block is a driver inverter that has three terminals. The first terminal is an input terminal that attaches to the output terminal of the level shifting inverter. The second terminal is the output terminal, where a buffered input signal appears. The third terminal is coupled to one of the two terminals of the third functional block, which is a voltage controlled device. Through this coupling, of the third terminal of the driver inverter and the first terminal of the voltage controlled device, the voltage controlled device reduces the signal propagation speed as noise conditions worsen; this device reduces the propagation speed by decreasing the switching speed of the driver inverter. Given the fact that the incorrect address state is caused by a noise spike of limited duration, the slowed response time of the driver inverter is effective in attenuating the detrimental noise effects.

The fourth functional block of this active filter, an improved noise filter reference voltage generator, supplies information regarding the noise conditions to the voltage controlled device. This generator uses two cascaded voltage generator circuits to produce a reference voltage that varies in a controlled and specific fashion with the changes in noise conditions, and supplies this voltage to the second terminal of the voltage controlled device. This improved noise filter reference voltage generation means and apparatus controls the variance of the reference voltage with respect to noise conditions in two manners. First, this generator utilizes a floating voltage source to increase the variance of the reference voltage with changes in the temperature. Second, this generator uses a feedback path, between the first and the second voltage generator circuits, to compensate for uncontrolled variations of the reference voltage caused by process variations.

DETAILED DESCRIPTION OF THE INVENTION

1. Active Filtering Method and Apparatus

The present invention discloses an adaptive active filtering method and apparatus that detects changes in noise conditions and reduces the active signal propagation speed as noise conditions worsen. Device performance is not impacted when noise conditions worsen since the device is operating at its fastest, and device performance is improved when the device is operating slower and the on-chip generated noise is less. Given device operation is disrupted by a noise spike of limited duration, selective reduction in the propagation speed of internal circuitry activation signals is effective in attenuating the detrimental noise effects. The filter is invisible to the signal deselection path. Finally, the present invention allows the fabrication of MOS integrated circuits which have smaller variation in their speed of operation over temperature, manufacturing process variation, and operating conditions than previous methods.

Figure 1:
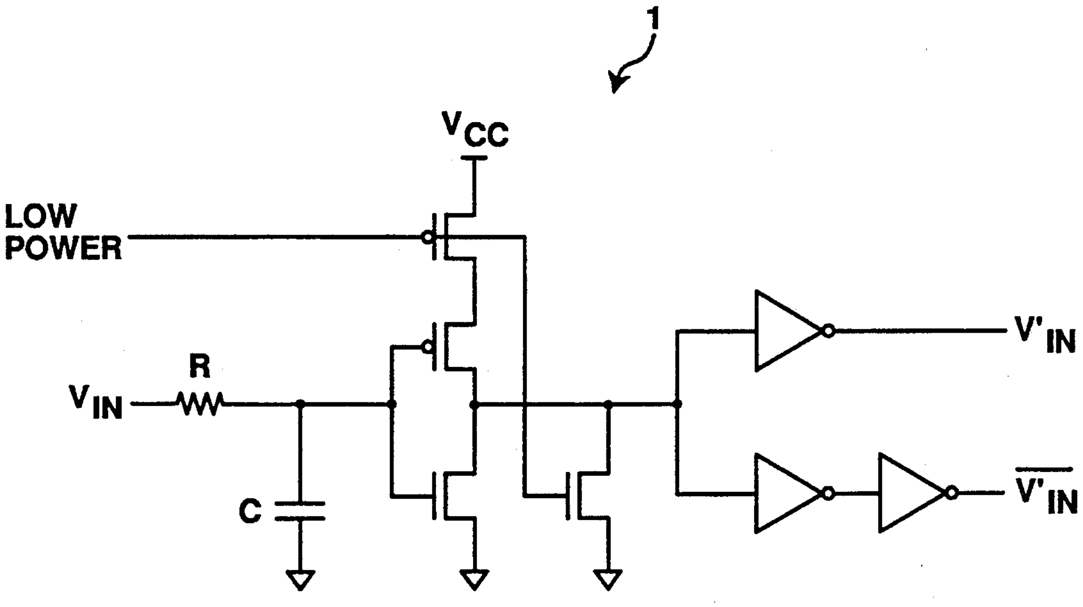
FIGURE 1 (Prior Art)
FIG. 1 is a circuit diagram of a prior art RC input noise filter.
Figure 2:
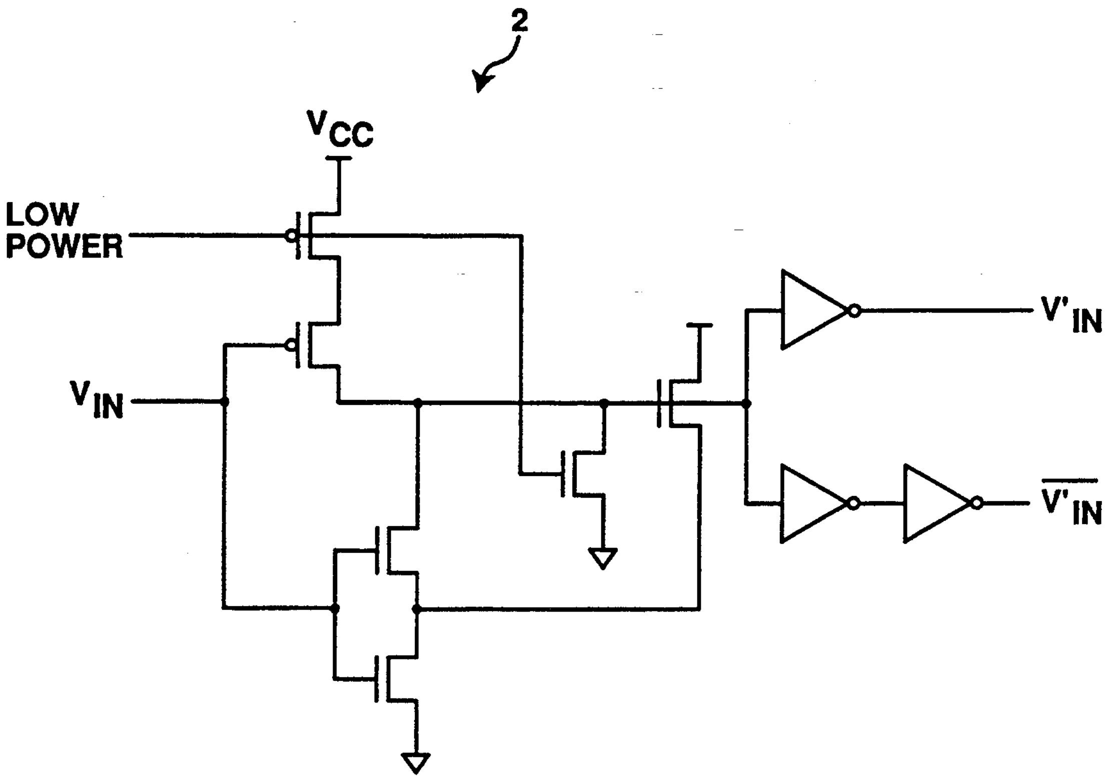
FIGURE 2 (Prior Art)
FIG. 2 is a circuit diagram of a prior art input buffer with hysteresis.
Figure 3:
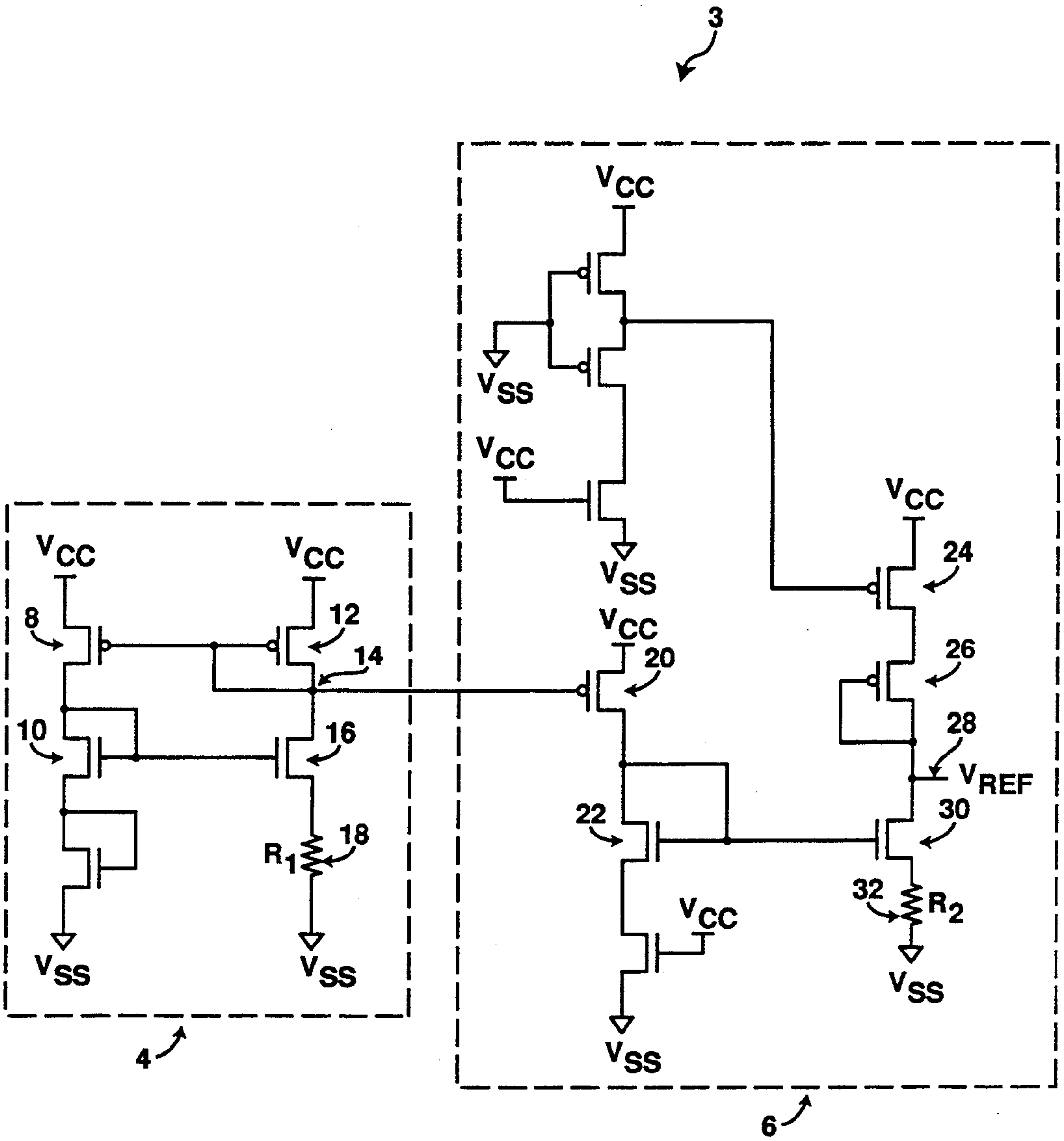
FIGURE 3 (Prior Art)
FIG. 3 is a circuit diagram of a prior art reference voltage generator.

In the following description, numerous specific details, such as schematic diagrams, voltages, etc. are set forth to provide a thorough understanding of the invention. However, it will be obvious to one skilled in the art that the invention may be practiced without the use of these specific details. In other instances, well-known circuits are shown in block diagram form in order not to obscure the present invention in unnecessary detail. In addition, in the accompanying figures, N-channel ("NMOS") transistors are illustrated as shown by transistor 10 of FIG. 3. The P-channel ("PMOS") transistors are illustrated as shown by transistor 8 of FIG. 3. All the transistors in the embodiment shown herein are enhancement mode devices. In the normal use of the invention, a power supply voltage is provided at the $V_{CC}$ connection shown in the figures. Typically, $V_{CC}$ is maintained at +5 volts. Also, in the normal use of the invention, the $V_{SS}$ connection shown in the figures is maintained at ground. Of course, other voltages may be utilized by those skilled in the art for $V_{CC}$ and $V_{SS}$.

Figure 6:
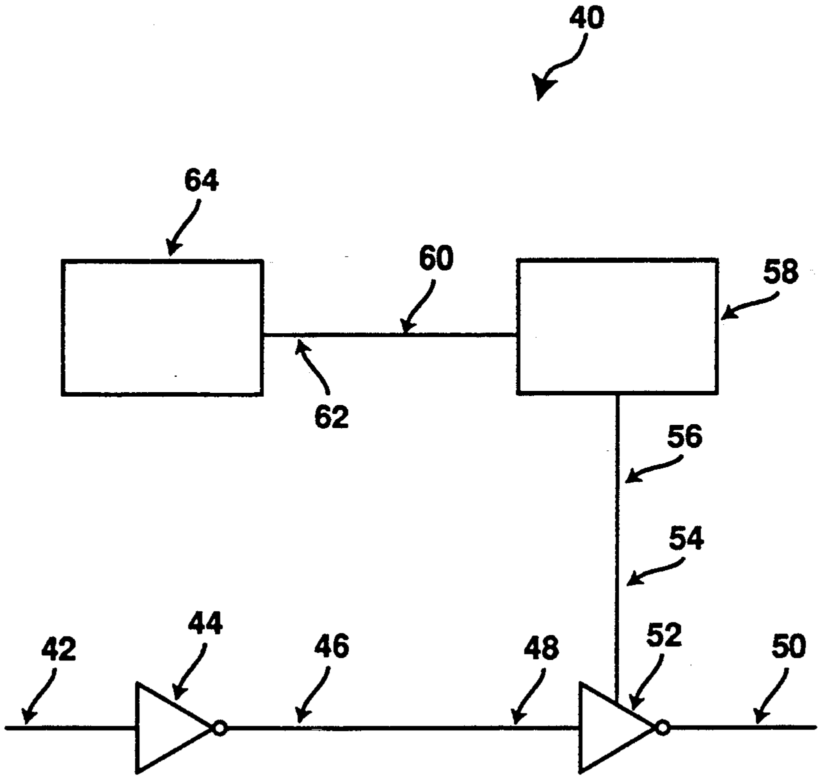
FIG. 6 is a block diagram of one embodiment of the adaptive active filter.

Referring now to FIG. 6, which shows one embodiment of the adaptive active filter. As FIG. 6 shows this active filter 40 has four functional blocks. The first functional block is level shifting inverter 44 that has two terminals. The first terminal is input terminal 42 and it serves as the input terminal of the buffer circuitry containing the active filter. The second terminal is output terminal 46, where an inverted version of the input signal appears; in addition, at the output terminal, the logic levels of the input signal have been converted into chip logic levels. The second functional block of this filter is driver inverter 52, that has three terminals. The first terminal is input terminal 48 that attaches to the output terminal of the level shifting inverter. The second terminal is output terminal 50, where a buffered input signal appears. The third terminal 54 attaches to one of the two terminals of the third functional block, which is voltage controlled device 58. Through this coupling, of the third terminal of the driver inverter and the first terminal 56 of the voltage controlled device, the voltage controlled device reduces the signal propagation speed as noise conditions worsen; this device reduces the propagation speed by decreasing the switching speed of the driver inverter.

The fourth functional block of this circuit noise filter, reference voltage generator 64, supplies information regarding the noise conditions to the voltage controlled device. This generator produces a reference voltage that varies with the changes in noise conditions, and supplies this voltage (via terminal 62) to the second terminal 60 of the voltage controlled device. In addition, in order for the reference voltage to serve as an accurate parameter on noise conditions, the reference voltage only varies in a specific and controlled fashion with the changes in the noise conditions, and several embodiments of this reference voltage generator will be described below.

Figure 7:
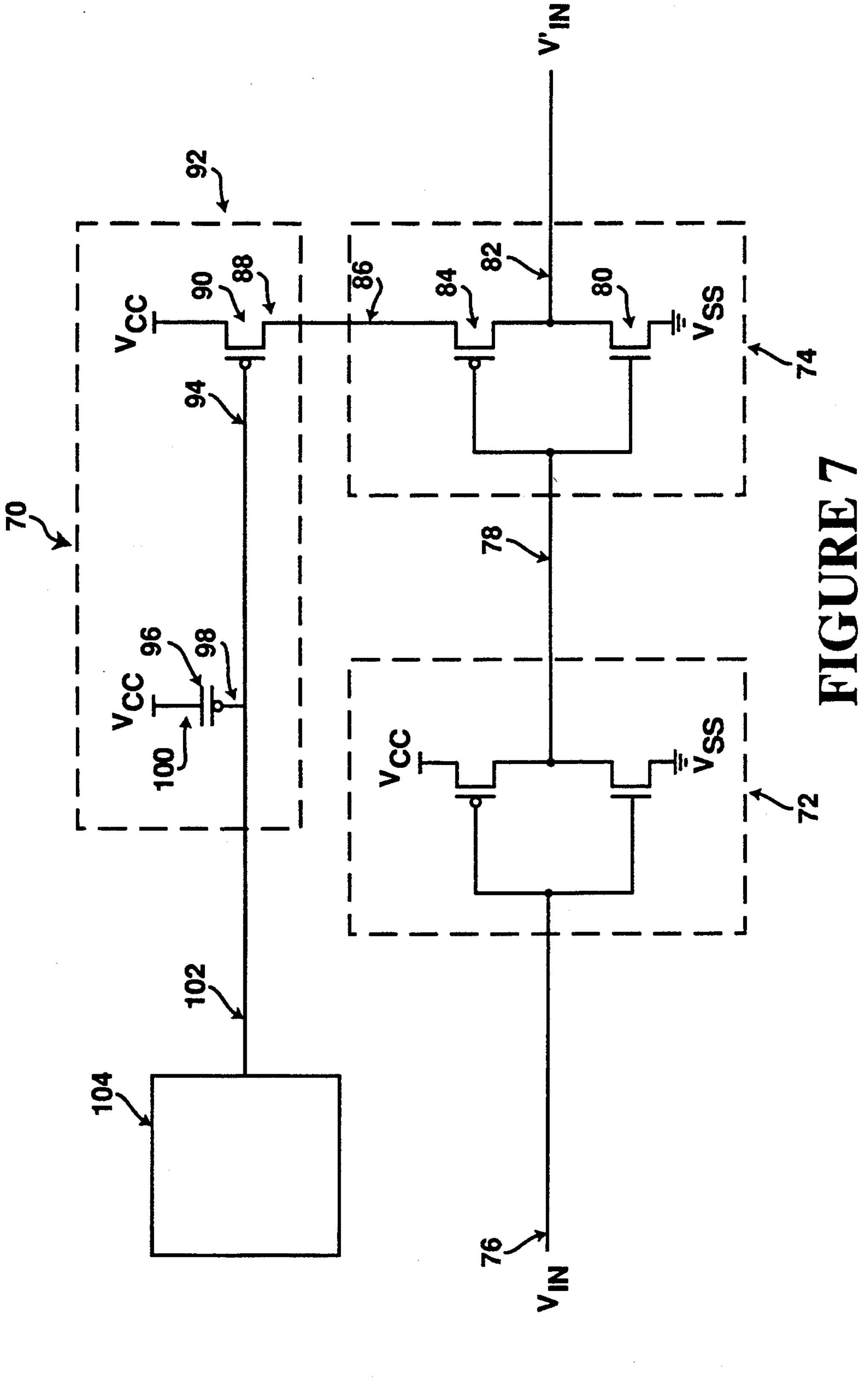
FIG. 7 is a circuit diagram of a second embodiment of the adaptive active filter.

FIG. 7 presents a more specific embodiment of the active filtering method and apparatus. This adaptive active filter 70 can be used to filter out noise at the input of fast multi-output chips, such as a CMOS RAM. In this embodiment, the level shifting inverter is a CMOS inverter 72, which can convert TTL logic levels into CMOS logic levels. In addition, the driver inverter is a special CMOS inverter 74, because the source 86 of its PMOS transistor 84 is not connected to the power supply; rather, this source is connected to the drain 88 of control transistor 90 which acts as the voltage controlled device. Capacitor 96 is included to permit rapid tracking of the noise filter reference levels to changes in device power supply levels. This active filter performs its filtering function (1) by supplying the gate of control transistor 90 with a reference voltage, produced by reference voltage generator 104, that varies in a controlled fashion with the changes in the noise conditions, and (2) by thus modulating the conductance (up or down) of the control transistor when noise conditions vary due to changes in supply voltage and process and temperature variations in transistor mobility. In other words, as noise conditions worsen, this control transistor slows down the signal propagation speed by decreasing the switching speed of the driver inverter.

To better understand how this circuit acts as a filter, a node analysis of this circuit's performance during high and low noise conditions is helpful. For the embodiment described, a high logic level on the input will enable subsequent RAM circuitry and a low logic level on the input will disable the subsequent circuitry. When a high input logic level is applied to input 76, the voltage at node 78 is low and the voltage levels are shifted to internal device logic levels due to inverter 72. A low voltage at node 78 turns off NMOS transistor 80, and turns on PMOS transistor 84. The voltage level on node 94 is maintained above the threshold voltage of PMOS device 90 such that a high logic level is maintained on node 86. When PMOS transistor 84 turns on, the high logic level on the source of PMOS transistor 84 is transferred to the output 82.

Figure 8:
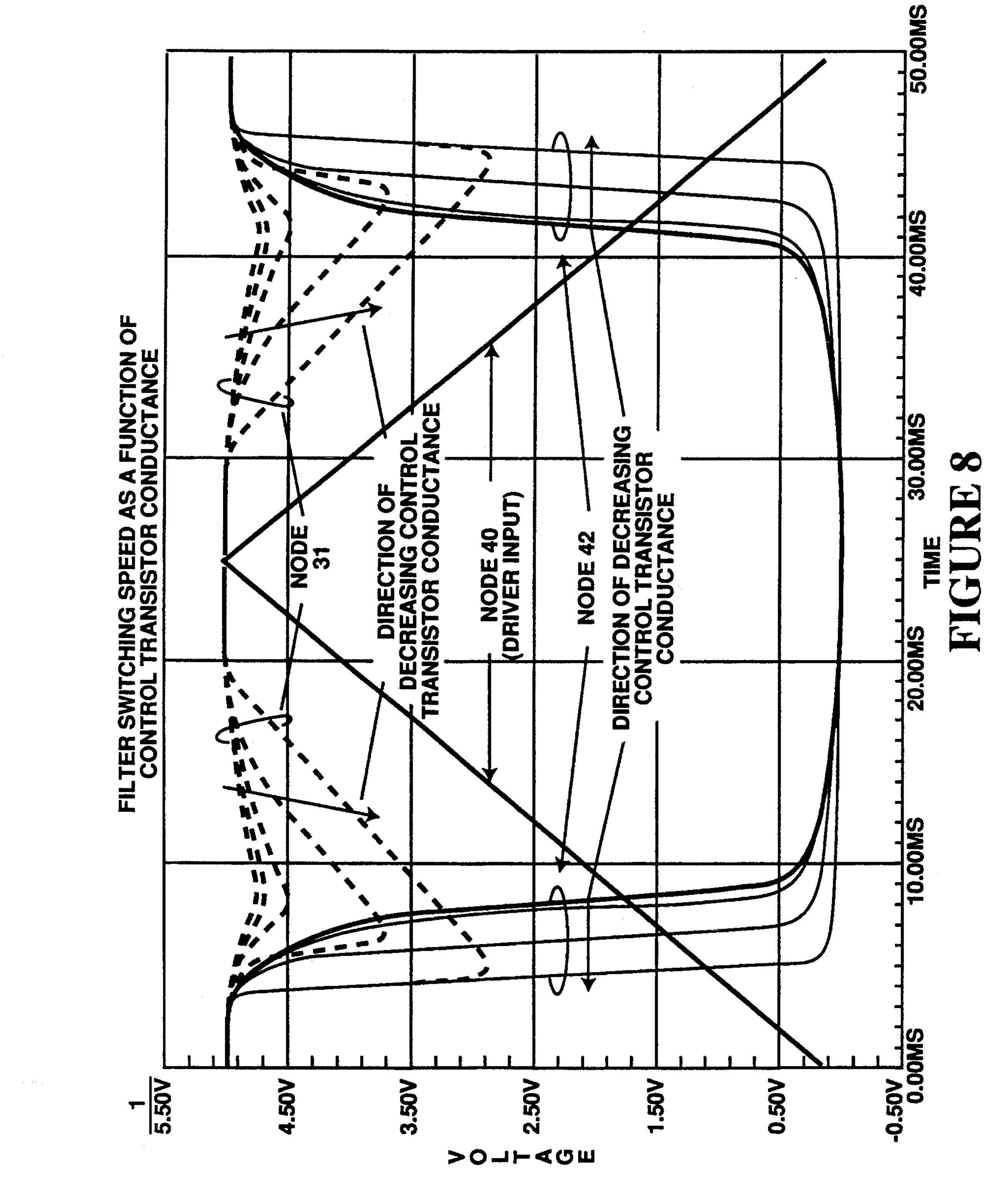
FIG. 8 is a graph of the switching speed of the driver inverter of FIG. 7 as a function of the control transistor's conductance.

Varying the voltage level on node 94 will modulate the conductance of PMOS device 90. As node 94 reduces the gate to source voltage on PMOS device 90, the transistor moves from a saturation region of operation (i.e. $|V_{GS}-V_{th}| <= |V_{DS}|$) towards a linear region of operation (i.e. $|V_{GS}-V_{th}| > |V_{DS}|$). The conductance of PMOS device 90 is lowered as the transistor gate to source voltage is lowered. As the transistor conductance is reduced, the transient response to voltage changes on node 86 (i.e. the drain of PMOS device 90 which is connected to the source of PMOS device 84) is slowed. When PMOS device 84 turns on, charge transferred from output node 82 will reduce the voltage on node 86 for a transient period of time and to a level determined by the conductance of PMOS device 90 as shown in FIG. 8. The switching level, or trip point, of the inverter formed by PMOS device 84 and NMOS device 80 is lowered with reduced high logic level on the source of PMOS device 84. The voltage response of output node 82 to a high to low voltage transition on node 78 is delayed by the additional time required to reach the lower trip point level. The speed at which output node 82 can transition from a low to high voltage level (i.e. the rise time) is also a function of the loading on node 82 and the drive capability of PMOS transistors 84 and 90. Limiting the conductance of PMOS transistor 90 will decrease the circuit's drive capability and add an additional delay to the time at which the switch point of the next circuit stage is achieved.

Figure 9:
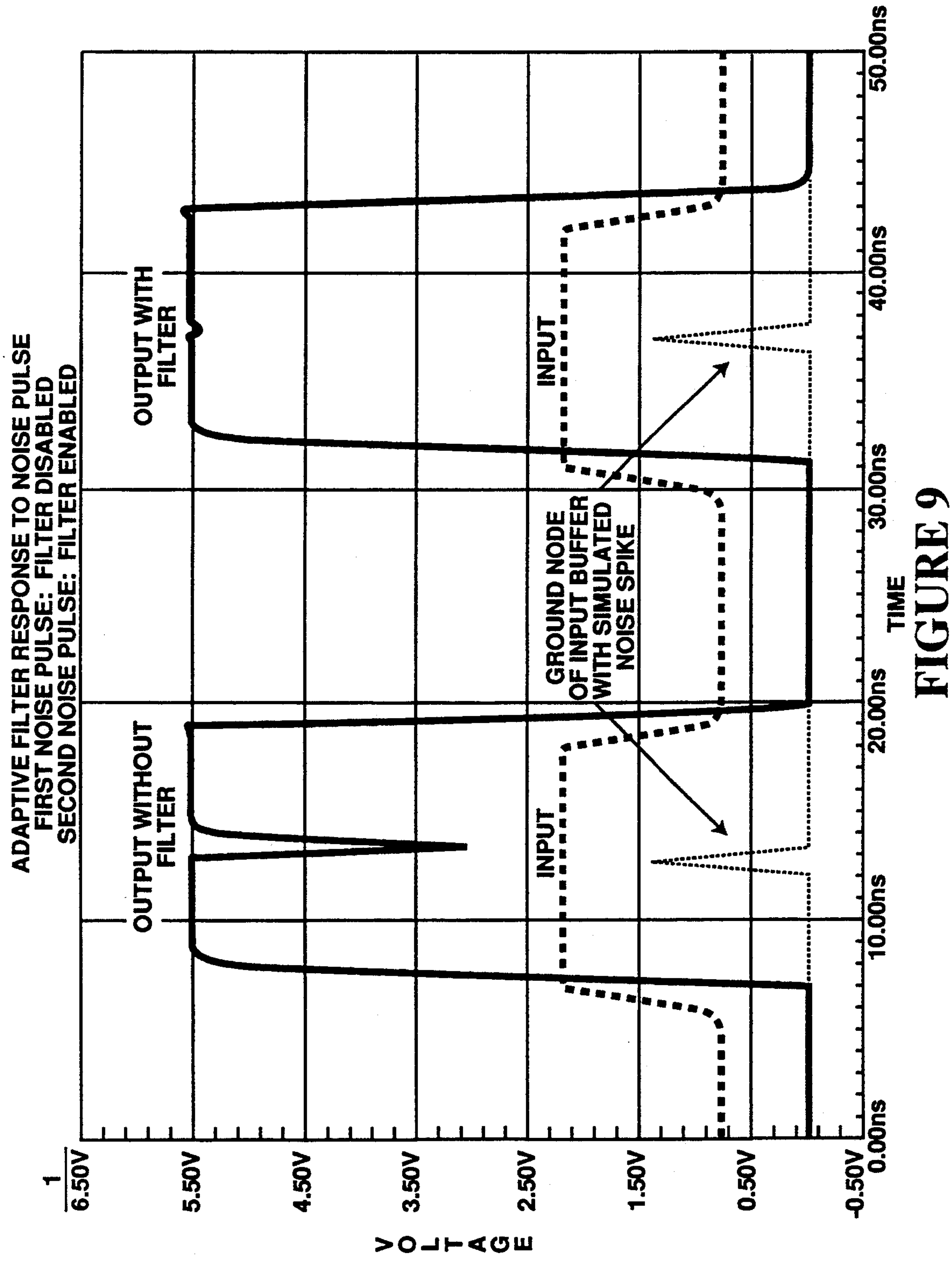
FIG. 9 is a graph that shows the effect of a noise spike on the output signal when the adaptive filter is disabled and when the adaptive filter is enabled.

During high noise conditions, a voltage spike (e.g. an electrostatic discharge that has limited duration) on the power supply lines of level shifting inverter 72 having sufficient magnitude will affect the switching level (i.e. trip point) such that node 78 makes an unwanted limited duration transition to the opposing logic level. Under these conditions, the noise filter reference voltage generator provides a high voltage at gate 94 of the control transistor 90. This high voltage reduces $V_{GS}$, which in turn reduces the possible current flow through the control transistor. Since limiting the amount of current that flows through the control transistor limits the switching speed of the drain of PMOS transistor 84, a controlled delay (longer than the duration of a typical noise spike) is introduced in the time it takes to reach the activation point of the next circuit block. Consequently, the noise spike is filtered out since the switching delay is longer than the duration of the noise spike. A graphical representation of this filtering is shown in FIG. 9.

On the other hand, during low noise conditions, the filtering function of this circuit is attenuated, because the control transistor no longer delays the activation of the subsequent circuit blocks. This control transistor does not perform its delaying function, since the reference voltage generator supplies a low voltage to the gate of the control transistor. This low voltage increases $V_{GS}$, which in turn increases the possible current that can flow through the control transistor. Thus, when the voltage at node 82 has to reach the high voltage level, sufficient current can flow through transistor 90 and 84 to rapidly initiate a transition on the inverter formed by NMOS transistor 80 and PMOS transistor 84 and raise the voltage at node 82 to the high voltage state.

There are two other aspects to adaptive active filtering circuit 70. First, in order to allow the control transistor gate voltage to quickly track with changes in the chip power supply, a capacitor 96 is added. In this circuit, this capacitor is obtained by tying the source and the drain 100 of a PMOS transistor to the power supply voltage and attaching the gate 98 to the gate of the control transistor.

Second, there is an optimum location of this control transistor in the address path of a memory chip. Ideally, the location of this transistor should be such that sufficient control of the signal's propagation delay is obtained, while not excessively loading the previous circuit stages. The CMOS RAM address path serves as a good example to show the ideal location of the control transistor for the embodiment described. This address path consists of an input pad, input protection, input buffer, predecoder, and a decoder. As it can be seen from FIG. 7, the preferred location for the control transistor, in the CMOS RAM address path, is in the driver stage of the input buffer. This control transistor can also be placed in a later stage in the address path. However, such a placement requires a much larger transistor sizes, since additional delay will result if the transistors are smaller; in addition, even if sufficient layout area is available, the larger transistor sizes lead to less noise filtering action, greater active current, and (when noise conditions are less and the fastest speed is desired) a slightly slower propagation delay. The control transistor can also be placed earlier in the signal chain. For example, it can be attached to the level shifting inverter. However, this placement results in level shifting interference, increased input capacitance, and increased input current.

2. Improvement to the Reference Voltage Generator

Figure 10:
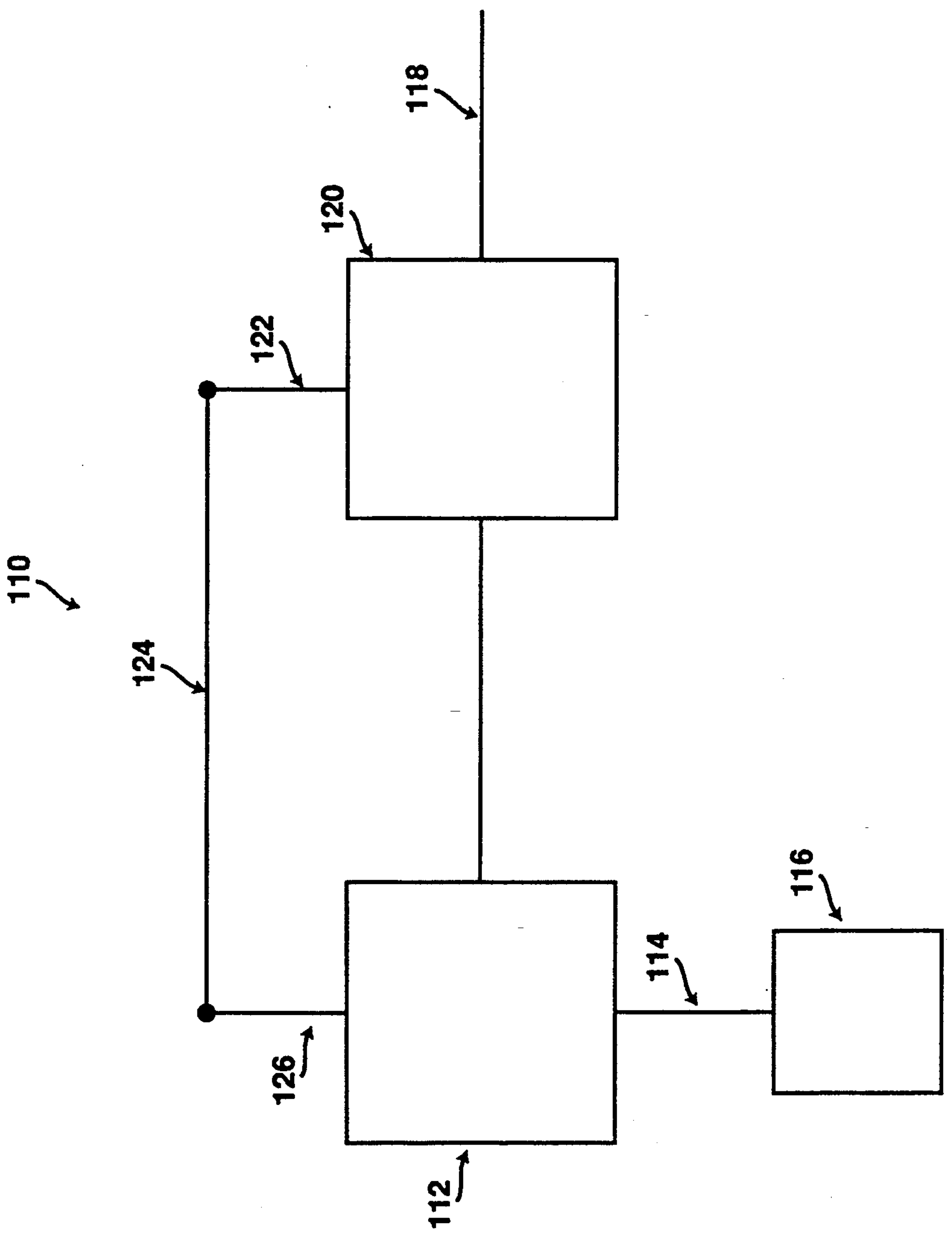
FIG. 10 is a block diagram of one embodiment of the improved noise filter reference voltage generator.

To properly control the adaptive active filter, the present invention uses an improved reference voltage generation means and apparatus, which produces a reference voltage that varies in a controlled and specific fashion with the changes in the noise conditions. FIG. 10 presents one embodiment of an improved reference voltage generator (e.g. reference voltage generator 64 of FIG. 6). This reference voltage generator 110 has two voltage generator circuits which are cascaded. The first voltage generator circuit 112 biases the second voltage generator circuit 120 to produce a reference voltage at output terminal 18. In two manners, this improved reference voltage generator acts to compensate for the natural response of MOS circuits to changes in variations in the components of which the circuit is constructed which would cause significant deviation from its desired characteristics. First, since the voltage generator circuits have circuit elements (i.e. resistors, transistors, etc.) that are temperature sensitive (i.e. changes in temperature affect the conductivity of these circuit elements), floating voltage source 116 is used to maintain the output characteristic curves within an acceptable range. FIG. 10 shows that this floating voltage source is connected to the second terminal 114 of the first voltage generator circuit. The floating voltage source's temperature coefficient is used to compensate for the negation of the temperature variation of the output characteristics; in other words, the floating voltage source should be attached to the reference voltage generator in such a manner so as to increase (in a controlled fashion) the temperature caused variations in the onset of the knee (i.e. region of maximum curvature) of the reference voltage.

Second, in order to produce a reference voltage that varies in a controlled and specific fashion with the changes in the noise conditions, feedback path 124 is established between the third terminal 126 of first voltage generator circuit and the third terminal 122 of the second voltage generator circuit. This feedback path compensates for uncontrolled variations in the reference voltage that are due to variations in the transistor conductance parameters. This feedback path compensates for these variations by adjusting the second voltage generator circuit's voltage response to process variations, to oppose the first voltage generator circuit's voltage response to the same process variations. In other words, the feedback path from the first voltage generator circuit alters the gate bias voltage of a transistor in the second voltage generator circuit to actually reverse the effect of N-channel to P-channel mobility variations.

Figure 11:
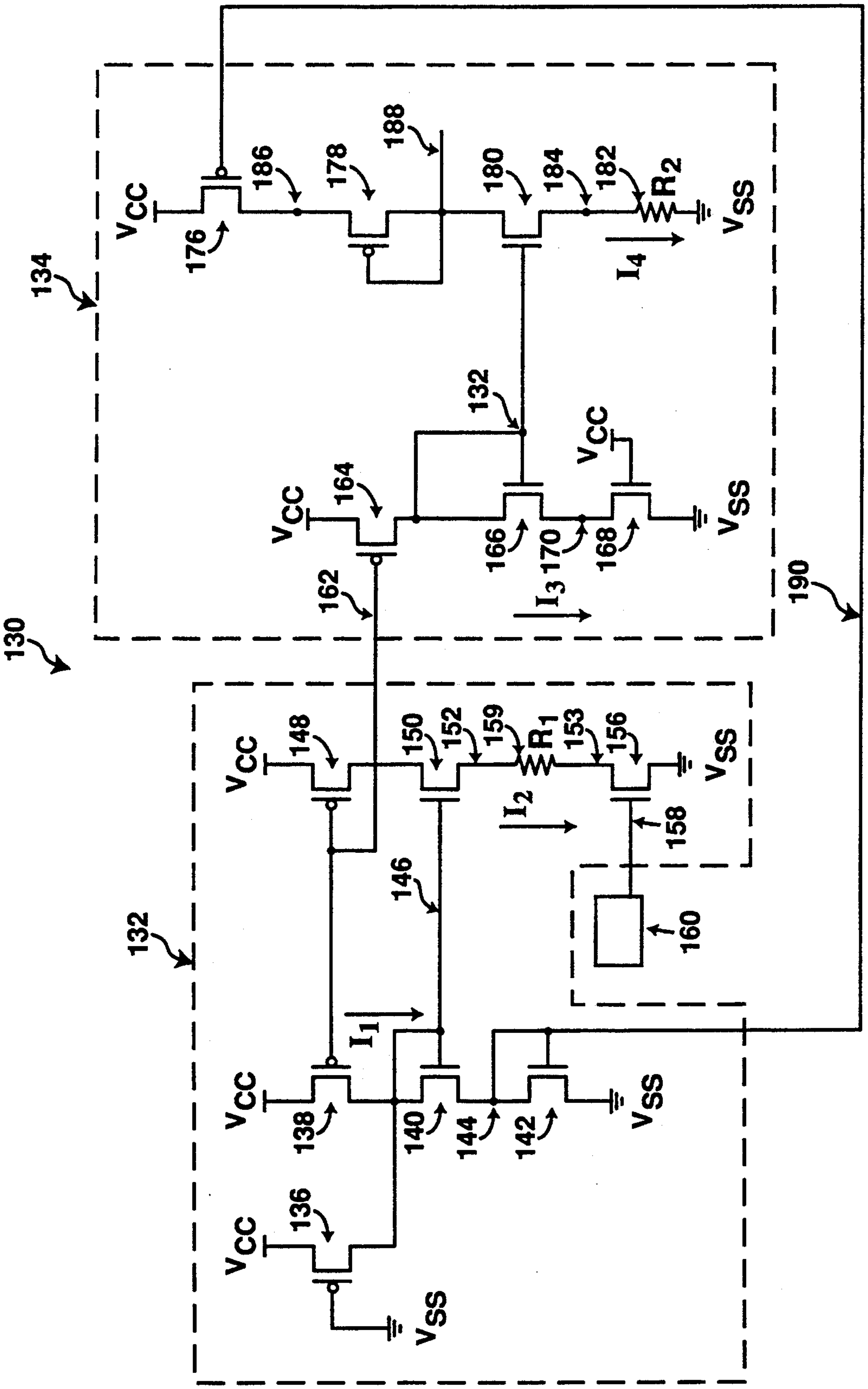
FIG. 11 is a circuit diagram of a second embodiment of the improved noise filter reference voltage generator.

FIG. 11 presents a more detailed embodiment of the improved reference voltage generator. This reference voltage generator 130 consists of two voltage generator circuits 132 and 134, which are cascaded (i.e. the output of the first voltage generator circuit, which appears at node 162, is coupled to the gate of PMOS transistor 164). In other words, the first voltage generator biases the second voltage generator circuit in order to enable the second voltage generator circuit to produce the output (i.e. the generated reference voltage appearing at node 188) of reference voltage generator 130.

To better understand how reference voltage generator 130 produces the reference voltage at node 188, a node analysis of this circuit is helpful. The voltage at node 144 of FIG. 11 is set by the mobility and threshold voltage ("Vth") of NMOS transistor 142, whose parameters vary with temperature and the physical dimensions of transistor 142, such as its gate width "W", gate length "L", and gate capacitance (Cox). More specifically, NMOS transistor 142 is biased so that its change in threshold voltage due to temperature variations compensates for its change in mobility due to temperature variations.

The voltage at node 152 is approximately equal to the voltage at node 144 because NMOS transistor 140 mirrors its gate voltage to the gate of NMOS transistor 150. The current $I_2$ through NMOS transistor 150 and PMOS transistor 148 is set by the resistance of resistor $R_1$ and the conductance of NMOS transistor 156. Current $I_2$ is equal to the difference between the voltages at nodes 152 and 153 divided by $R_1$. This current $I_2$ is then mirrored back to NMOS transistor 142 by the current mirror formed by PMOS transistors 138 and 148. More specifically, resistor $R_1$, through the current mirror, feeds back to NMOS transistor 142 the current that is stabilized by modulating the voltage at node 152. In addition, current $I_2$ establishes the output of the first voltage generator circuit 132 at node 162, since current $I_2$ determines the voltage drop across transistor 148 and since the output voltage at node 162 is equal to the power supply voltage ($V_{CC}$) minus the voltage drop across transistor 148. Finally, as it will be further discussed below, the controlled variance of the reference voltage "knee" with changes in temperature and supply voltage is established with the positive temperature coefficient floating voltage source 160 and NMOS transistor 156.

It should be noted that for the proper operation of the circuit shown in FIG. 11, PMOS transistors 138 and 148 and NMOS transistors 140 and 150 should be maintained in saturation. Also, PMOS transistor 136 is included in reference voltage generator circuit 130 in order to assure that the circuit becomes functional when it is initially powered up. This transistor should be constructed with a high resistance by making its gate length large. Gate length is used herein to mean the average distance under the insulated gate between the source and the drain of the transistor. Transistor 136 is used because, without it, it is possible that the circuit will remain off upon powering up. By including the transistor 136, it is assured that NMOS transistors 150 and 140 will be turned on, which will then cause PMOS transistors 138 and 148 to become functional.

Referring now to the second voltage generator circuit 134 of FIG. 11, NMOS transistor 168 is biased to operate in its linear region of operation. As the temperature decreases, the transconductance of an MOS device, such as NMOS 168, increases with electron mobility, as defined by the formula $u_{eff}=u_o[(273+X\ ^\circ\ C.)/300^\circ\ K]^{-1.5}$, where $u_o$ is the mobility measured at 27 degrees Centigrade and X is the operating temperature of the circuit. Generally, when the transconductance increases, the current through the source and drain ($I_{DS}$) of an MOS device increases. When a MOS device operates in its linear region of operation, the current through the source and drain of the device is given by $I_{DS}=u_{eff}(W/L)C_{ox}(V_{GS}-V_{th}-V_{DS}/2)V_{DS}$. Thus, it can be seen that as the temperature decreases, the effective resistance of NMOS transistor 168 decreases. Since PMOS transistor 164 acts as a current source (the voltage at node 162 is controlled by transistors 142 and 156 and floating voltage source 160), the voltage at node 170 drops with decreasing temperature; the voltage at node 170 drops to the value of the voltage across the source and drain of NMOS transistor 168 that sustains the current flow $I_3$ through NMOS transistor 166.

The voltage at node 184 tracks the voltage at node 170, since node 172 is the gate of NMOS transistors 166 and 180. The current $I_4$ is fixed by the voltage on node 184 from the size of the resistor $R_2$, such that $I_4$ is equal to V(184) divided by $R_2$. Fixing $I_4$ determines the voltage drops across PMOS transistors 176 and 178. It can be seen that the voltage at node 188 (i.e. the generated reference voltage of reference voltage generator 130) is given by the expressions $V(188)=V_{SUPPLY}-V_{DS}$(PMOS transistor 176)$-V_{DS}$(PMOS transistor 178). Since the voltage at node 184 tracks the voltage at node 170, and since the voltage at node 184 is equal to $(I_4)(R_2)$, it can be seen that $I_4$ will decrease when temperature decreases. That is, voltage variation at node 170 will cause proportional current variation through $R_2$. When the temperature decreases, $I_4$ will decrease; when the temperature increases, $I_4$ will increase. It can be seen that when $I_4$ decreases, the voltage at node 188 (i.e. the generated reference voltage of reference voltage generator 130) increases; similarly, when $I_4$ increases, the voltage at node 188 decreases. Thus, reference voltage generator 130 of FIG. 11 produces a reference voltage at node 188 which varies with changes in temperature. In addition, controlled temperature variation of the reference voltage with supply voltage at node 188 is increased with the use of floating voltage source 160 and NMOS transistor 156 and this aspect of the invention will be described below.

PMOS transistor 178 is used to offset the voltage at node 188 from the voltage at node 186 by a P-channel transistor threshold voltage. The drain to source voltage drop across PMOS transistor 176 will then set the voltage at node 188. PMOS transistor 176 works in concert with NMOS transistor 168 because, as temperature decreases, the transconductance of PMOS transistor 176 increases, causing the drop across PMOS transistor 176 to be less, which in turn increases the voltage at node 188. Finally, PMOS transistor 164 should be maintained in saturation to properly act as current source for second voltage generator 134.

Two additional aspects of reference voltage generator 130 need to be discussed. First, since the transistors and the temperature sensitive diffusion resistors used in implementing reference voltage generator 130 both have positive temperature coefficients (i.e. as the temperature increases, the conductance of the transistors and resistors decreases), reference voltage generator 130 uses a positive temperature coefficient floating voltage source 160 (i.e. a voltage source that produces a voltage which varies proportionally with changes in temperature) to increase in a controlled fashion the temperature caused variation in the reference voltage. To best observe the effect of the floating voltage source, an initial analysis of the reference voltage generator 130 without floating voltage source 160 is helpful (i.e. assume that floating voltage source 160 and transistor 156 are removed and that the end of resistor $R_1$ that was coupled to transistor 156 is coupled to $V_{SS}$). Under these conditions (and with proper transistor sizing, i.e. matching the physical parameters of transistor 138 with 148 and matching the physical parameters of transistor 140 with 150), N-channel transistor 142 is biased so that its change in threshold voltage due to temperature variations compensates for its change in mobility due to temperature variations. As previously mentioned, resistor $R_1$ of the first stage voltage generator 132 feeds back the temperature stabilized current $I_2$ to N-channel 142 through the current mirror by modulating the voltage at node 152. In addition, the change in voltage on node 152 with temperature is mirrored by the first stage voltage generator output node 162 through N-channel 150. The result is to stabilize the current $I_3$ (and thereby stabilize current $I_4$) through the second stage voltage generator 134. In other words, the circuit configuration and matching temperature coefficients of the transistors and resistors act to compensate for the effects of transistor variations due to temperature changes. Consequently, without floating voltage source 160 and transistor 156, the point of onset of maximum curvature of the reference generator output characteristics will stay within a tight supply voltage range for variations in temperature.

However, by attaching floating voltage source 160 and transistor 156 to the first generator circuit as shown in FIG. 11, the point of maximum curvature of the output characteristics can be controlled in such a manner to spread the "knee" over a limited range in supply voltage for various temperatures. By spreading the "knee" in a controlled fashion, the reference generator will provide the appropriate levels for the active filter's control transistor during the specific noise conditions (i.e. the output is high when the supply voltage is high and the temperature is low, and the output is low when the supply voltage is low and the temperature is high).

The floating voltage source achieves this result by (1) increasing the gate to source voltage of NMOS transistor 156, which is placed in series with the first voltage generator circuit's resistor element, when the temperature increases, and (2) decreasing the gate to source voltage of NMOS transistor 156 when temperature decreases. In other words, floating voltage source 160 and transistor 156 counteract the reduced transistor and resistor conductance with increasing temperature by increasing current $I_2$ (which in turn increases second stage voltage generator currents $I_3$ and $I_4$). This results in pushing the onset of maximum curvature of the reference generator's output towards higher values of supply voltage for increasing temperatures. Similarly, as temperature decreases, transistor 156 (whose $V_{GS}$ is decreased by floating voltage source 160) decreases current $I_2$, which in turn decreases currents $I_3$ and $I_4$ in the second voltage generator and results in moving the onset of maximum curvature of the reference generator's output towards lower values of supply voltage for decreasing temperatures. Thus, the "knee" of the reference generator output characteristics is spread over a wider range in supply voltage with changes in temperature, since the floating voltage source acts in an opposing manner to the rest of the generator circuitry. Using the floating voltage source in this manner, one can mimic the effects achieved if the transistor and the resistor elements had opposing temperature coefficients.

Figure 12:
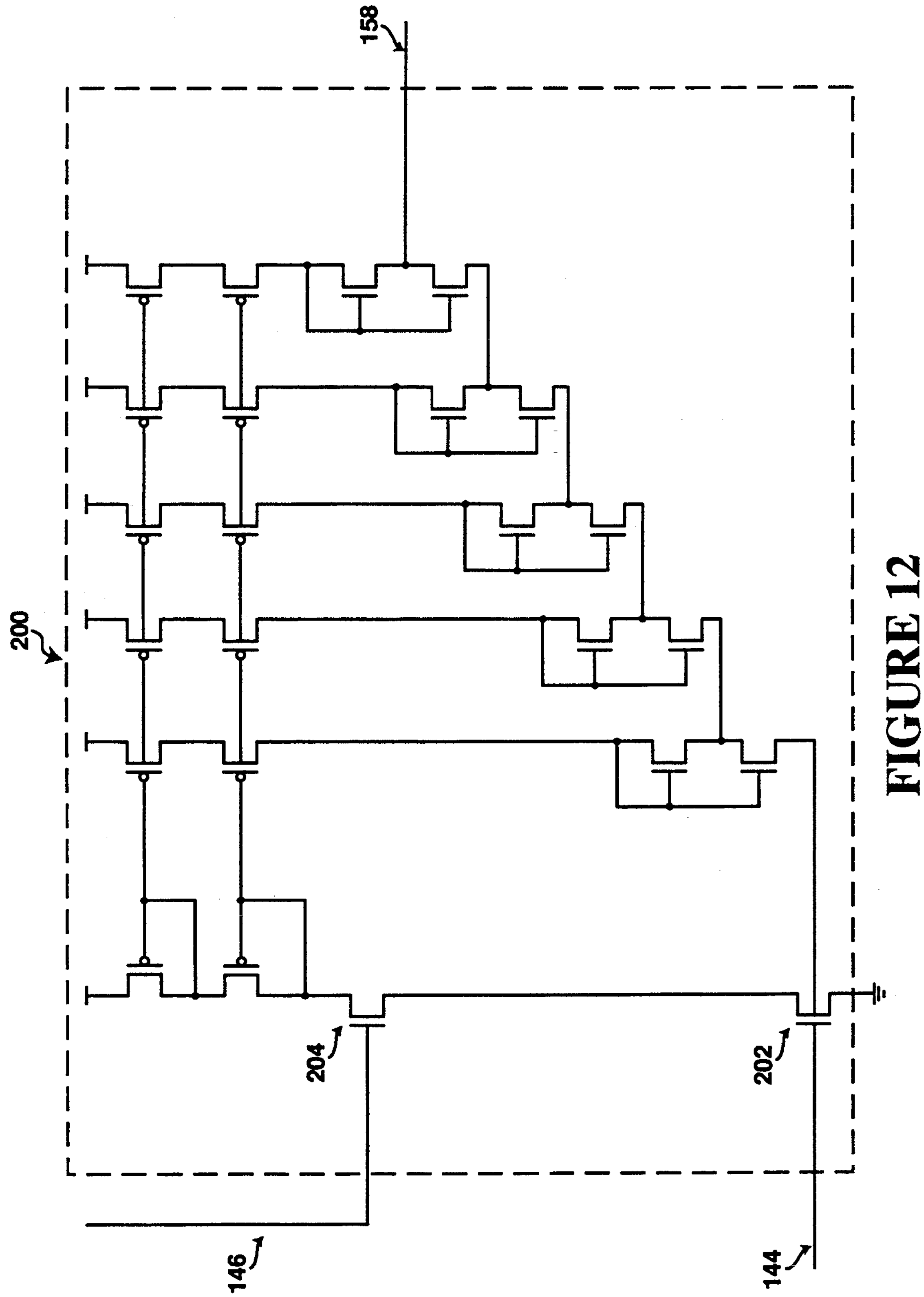
FIG. 12 is a circuit diagram of a floating voltage source.

One prior art embodiment of a positive temperature coefficient floating voltage source 160 is shown in FIG. 12. The operation of this prior art floating voltage source is discussed in an article by W. M. Sansen, F. Opteynde, and M. Steyaert ("A CMOS Temperature-Compensated Current Reference," IEEE Journal of Solid-State Circuits, Vol. 23, No. 3, June 1988). As this article discloses, in order for floating voltage source 200 to be operational, the voltage at the gate of transistor 202 approximately should equal $V_{th}$ and the voltage at the gate of transistor 204 approximately should equal $2V_{th}$. Consequently, as shown in FIG. 12, if floating voltage source 200 is used as floating voltage source 160, the gate of transistors 202 and 204 should be respectively coupled to nodes 144 and 146 of reference voltage generator 130. Finally, a second positive temperature coefficient floating voltage source is disclosed in an article by Henri J. Oguey and Bernard Gerber ("MOS Voltage Reference Based On Polysilicon Gate Work Function Difference," IEEE Journal of Solid-State Circuits, Vol. SC-15, No. 3, June 1980).

Second, in order to compensate for uncontrolled variations in the reference voltage that are due to process caused variations in the transistor conductance parameters (i.e. in order to compensate for the differences in the conductance parameters of the NMOS and the PMOS transistors), feedback path 190 is established between the first and second voltage generator circuits 132 and 134. This feedback path compensates for these variations by adjusting the second voltage generator circuit's voltage response, to process variations, to oppose the first voltage generator circuit's voltage response, to process variations. More specifically, the feedback path from the first voltage generator circuit alters the gate bias voltage of a transistor in the second voltage generator circuit (i.e. feedback path 190 forms a gate bias control path to PMOS transistor 176) to actually reverse the effect of N-channel to P-channel mobility variations. For example, assume that the PMOS transistors are slow and the NMOS transistors are fast. Because the voltage generators are cascaded, the voltage at node 188 faces a double pull down effect.

However, with the use of the feedback path, the strong N-channels in the first stage acting to reduce the first voltage generator circuit's output level is used to increase the gate bias voltage of transistors in the second voltage generator circuit to such a degree that the transconductance of the transistors is actually increased to reverse the effect by effectively strengthening the P-channel drive. In other words, the feedback path applies the reduced voltage at node 144 (this voltage is reduced due to the first stage reference circuit's response to stronger NMOS transistors) to the gate of the PMOS transistor 176, and thus strengthens this transistor (i.e. PMOS transistor 176) by maximizing its $V_{GS}$; in turn, the strengthened PMOS transistor 176 off sets the double pull down effect at node 188, because it can now sink more current to $V_{CC}$.

Figure 4:
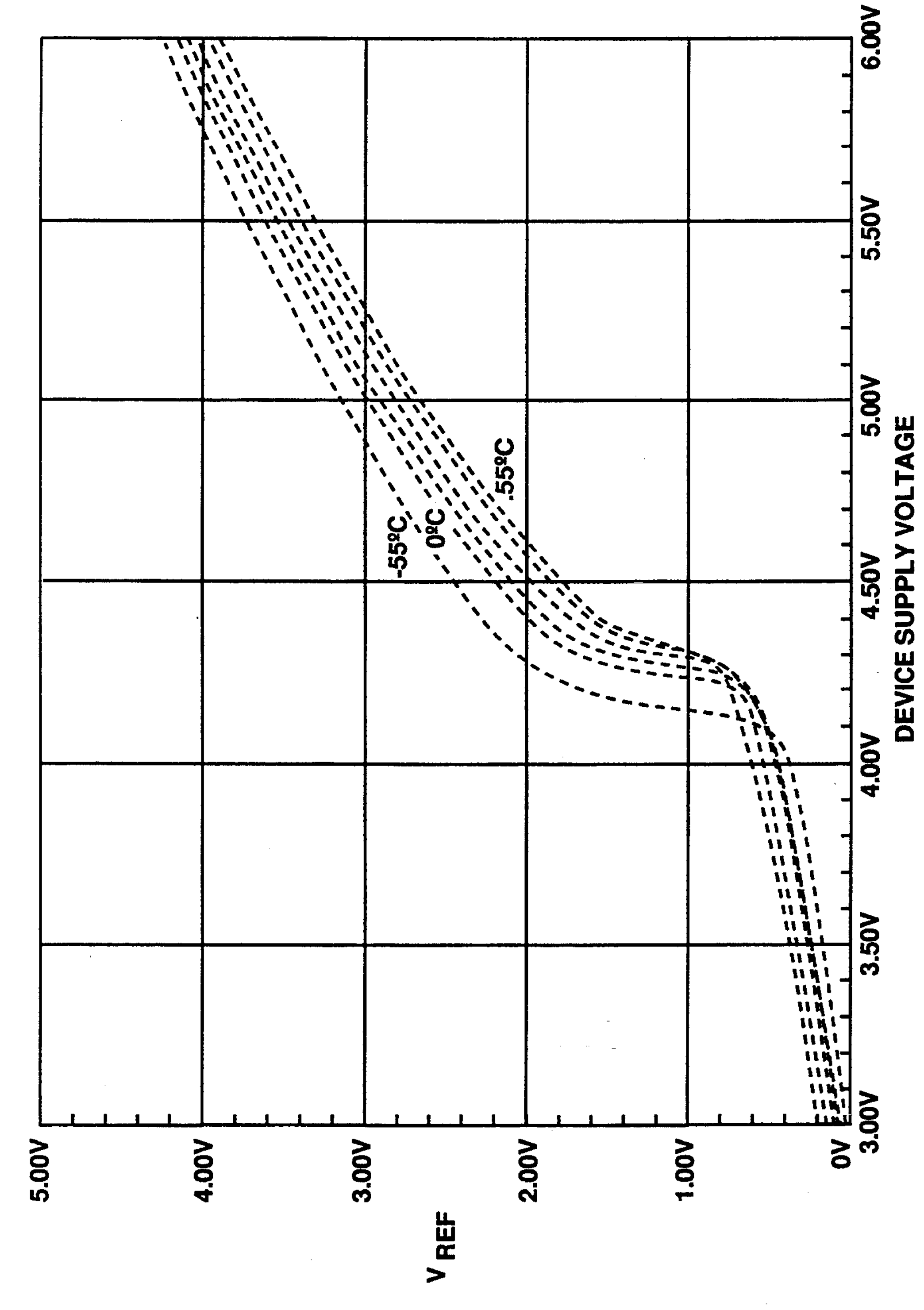
FIGURE 4 (Prior Art)
FIG. 4 is a graph of the reference voltage characteristics of the prior art reference voltage generator shown in FIG. 3, with temperature sensitive resistors and typical N-channel and typical P-channel transistors.
Figure 5:
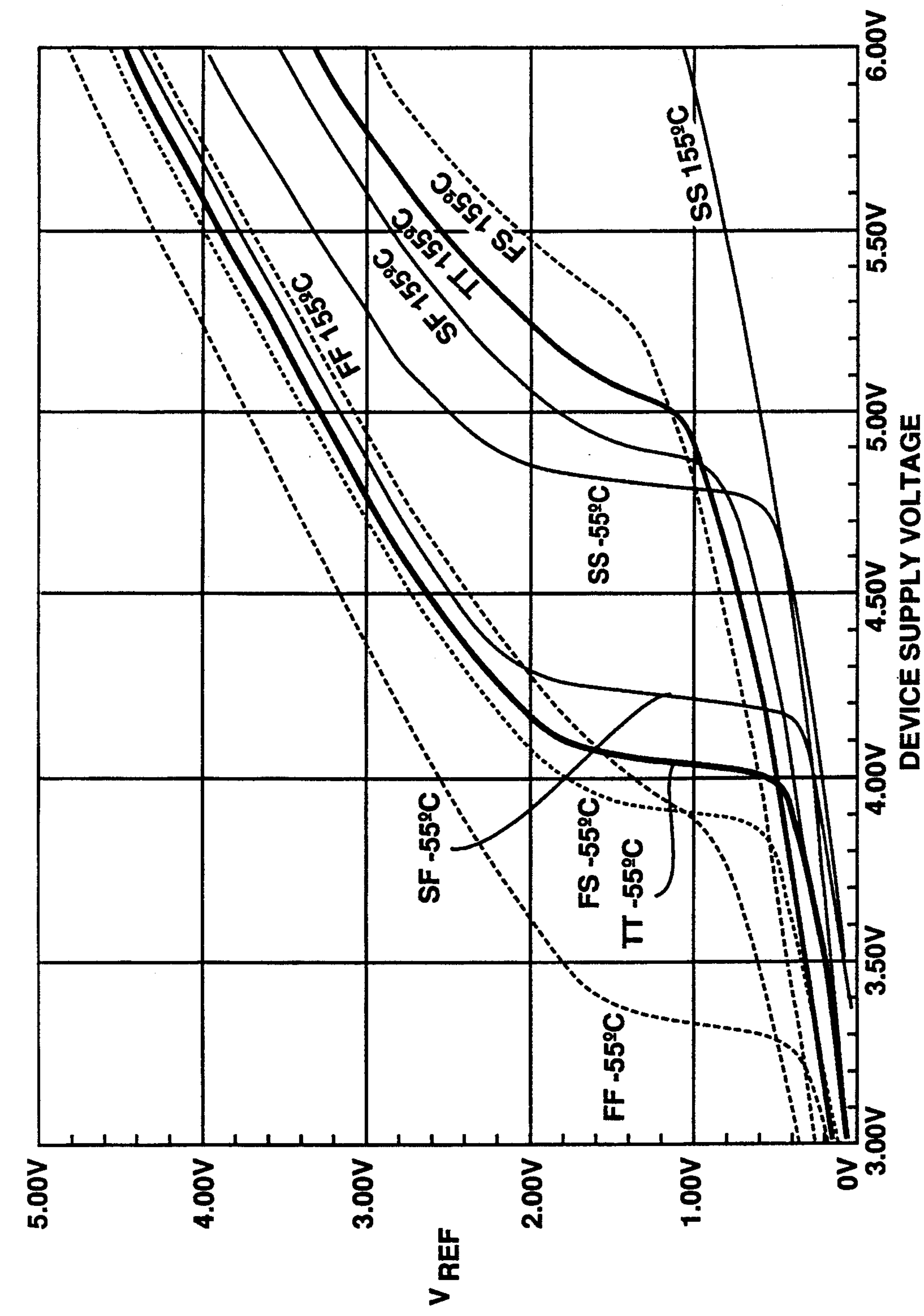
FIGURE 5 (Prior Art)
FIG. 5 is a graph of the reference voltage characteristics of the prior art reference voltage generator shown in FIG. 3, for five different processes (transistor conductance skews) with temperature insensitive resistors
Figure 13:
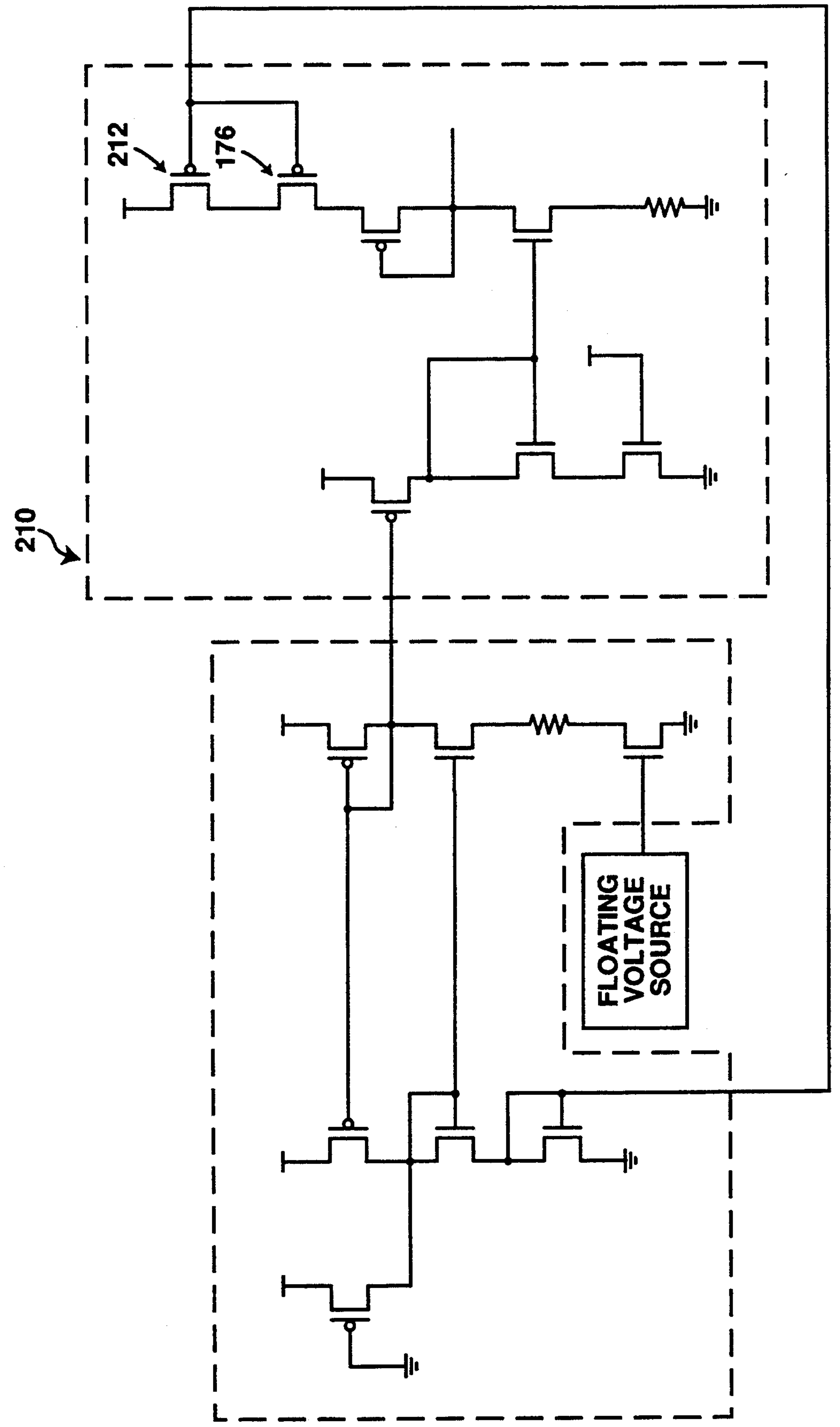
FIG. 13 is a circuit diagram of a third embodiment of the improved noise filter reference voltage generator.
Figure 14:
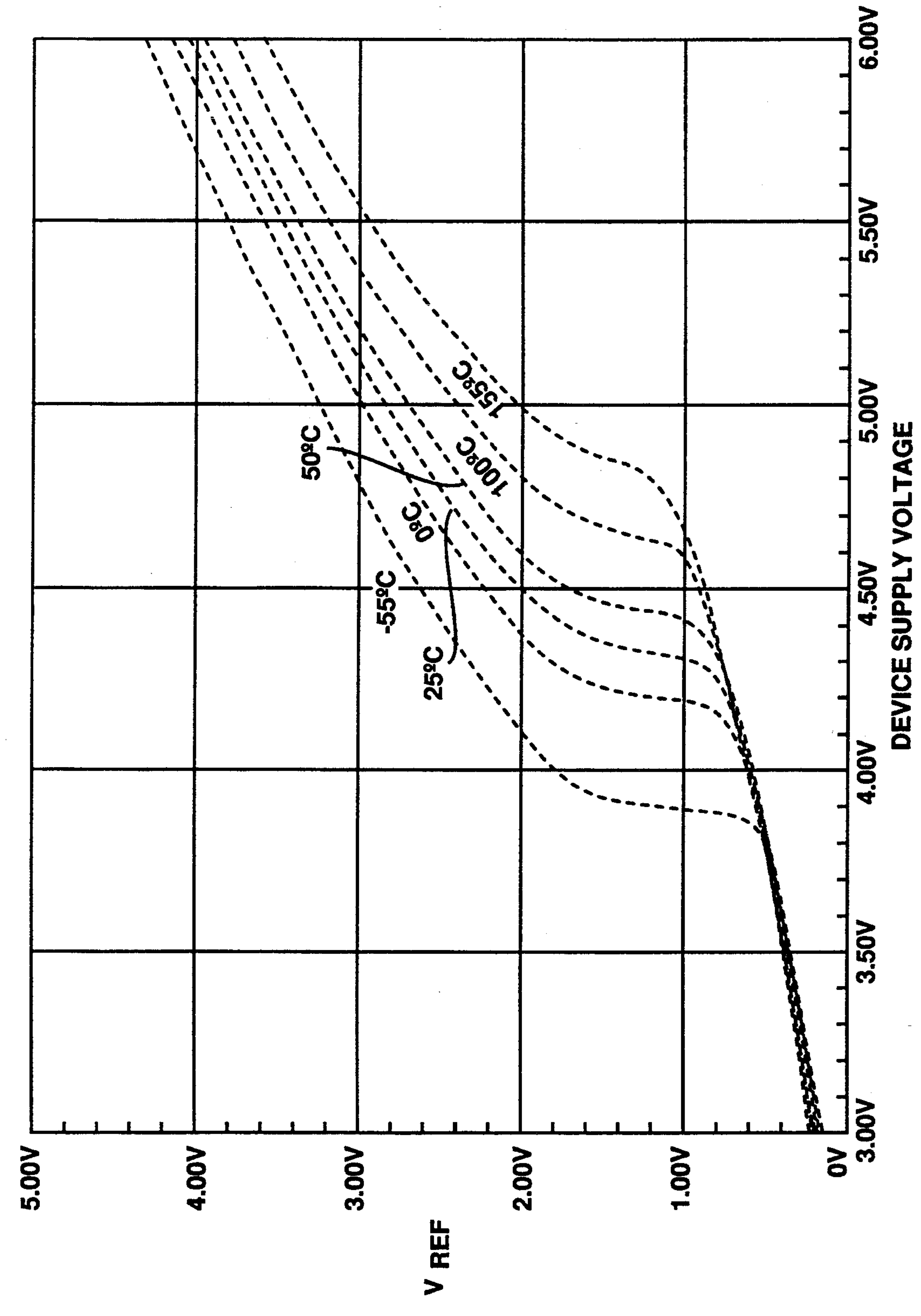
FIG. 14 is a graph of the reference voltage characteristics of the improved noise filter reference voltage generator of FIG. 13 with temperature sensitive resistors and typical N-channel and typical P-channel transistors.
Figure 15:
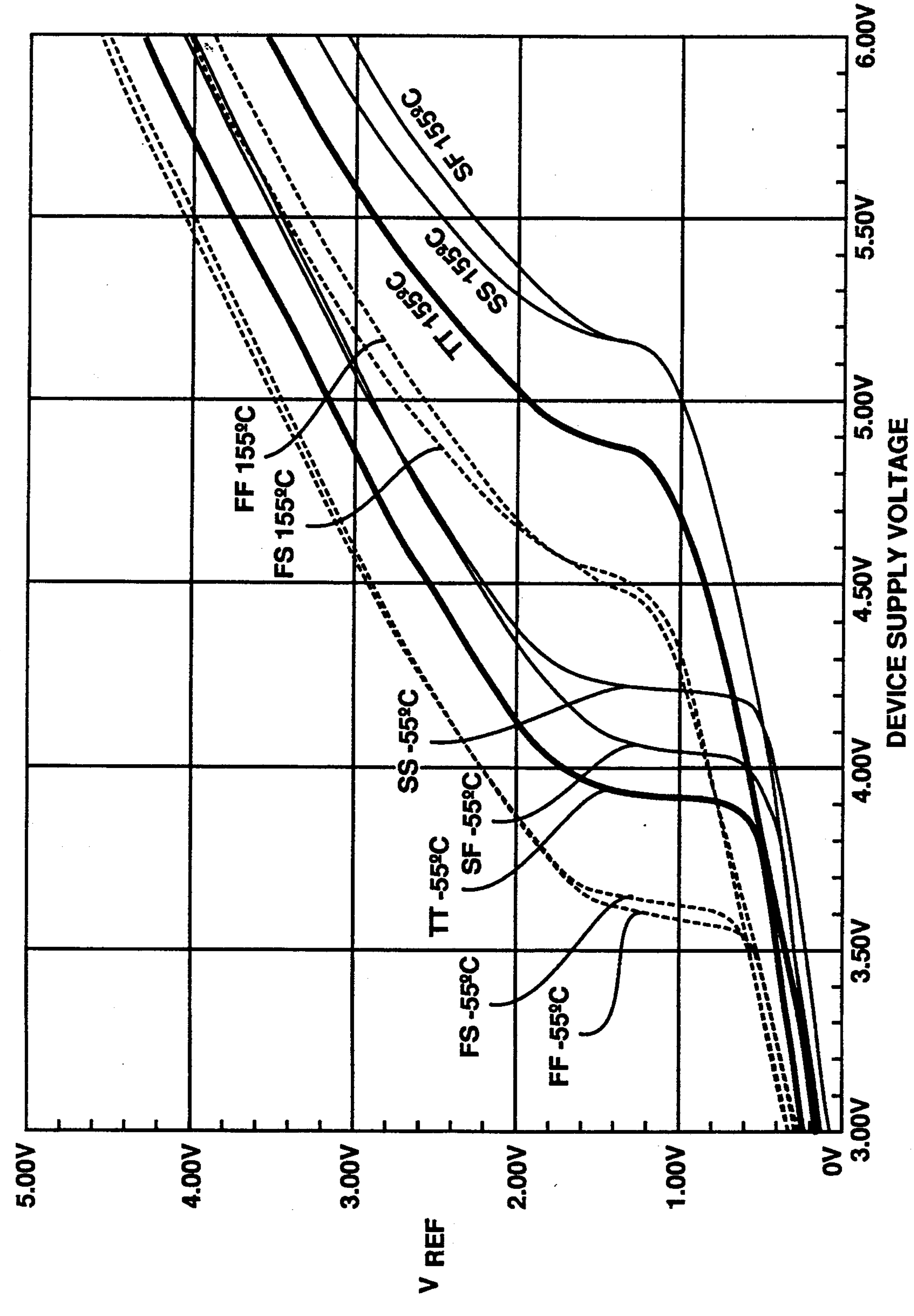
FIG. 15 is a graph of the reference voltage characteristics of the improved noise filter reference voltage generator of FIG. 13, for five different processes (transistor conductance skews) with temperature sensitive resistors.

FIG. 13, shows yet another embodiment of the improved reference voltage generator. In this generator 210, transistor 176 is cascoded to transistor 212, in order to make transistors 176 and 212 less sensitive to variations in transistor conductance parameters. This cascoding makes the transistors less sensitive to process variations, because it decreases short channel effects. The reference voltage characteristics curves of this improved reference voltage generator is presented in FIG. 14. As can be seen from a comparison of the curves in FIG. 14 with respect to those in FIG. 4, the output characteristics correspond to the desired control of the noise filter operation over the temperature spectrum. Additionally, as can be seen from a comparison of the curves in FIG. 15 with respect to those in FIG. 5, the output characteristics of the reference voltage generator with process variation is much improved. There is a low voltage level corresponding to low noise conditions, there is a high voltage level corresponding to high noise conditions, and there is a knee within the device operating range corresponding to intermediate noise conditions.

I claim:

1. A voltage generator, used to produce a reference voltage that varies with noise conditions, comprising:
- (a) a first voltage generator circuit producing an output voltage;
- (b) a second voltage generator circuit having an input terminal and producing said reference voltage;
- (c) wherein each of said voltage generator circuits comprises:
  - a first set of transistors having a first conductance parameter, and
  - a second set of transistors having a second conductance parameter;
- (d) a cascading means for supplying said output voltage to said input terminal of said second voltage generator circuit; and
- (e) feedback means coupled to said first and second voltage generator circuits for compensating for uncontrolled variations in said reference voltage caused by variations between said first conductance parameter and said second conductance parameter.

2. The voltage generator of claim 1, wherein said voltage generator further comprises a floating voltage source connected to at least one of said first voltage generator circuit and said second voltage generator circuit.

3. The voltage generator of claim 2, wherein said first set of transistors are N-channel MOS transistors and said second set of transistors are P-channel MOS transistors.

4. The voltage generator of claim 3, wherein said floating voltage source has a temperature coefficient that enables said floating voltage source to increase the voltage generator's temperature dependence in a controlled fashion.

5. The voltage generator of claim 4 wherein at least one of said voltage generator circuits comprises at least one transistor having a positive temperature coefficient and at least one of said voltage generator circuits comprises at least one resistor having a positive temperature coefficient.

6. A voltage generator for producing a reference voltage comprising:
- (a) a first voltage generator circuit having a first set of circuit elements;
- (b) a second voltage generator circuit having a second set of circuit elements;
- (c) at least one of said sets of circuit elements includes a first set of temperature sensitive circuit elements and at least one of said sets of circuit elements includes a second set of temperature sensitive circuit elements, wherein changes in temperature cause variations in conductance of said temperature sensitive circuit elements, and wherein temperature-caused changes in conductance of said first set of temperature sensitive circuit elements induce variations in said reference voltage;
- (d) coupling means for cascading said first voltage generator circuit to said second voltage generator circuit;
- (e) an output terminal connected to said second voltage generator circuit, wherein said reference voltage appears at said output terminal; and
- (f) means for preventing temperature-caused changes in conductance of said second set of temperature sensitive circuit elements from negating variations in said reference voltage with temperature.

7. The voltage generator of claim 6, wherein each of said sets of circuit elements comprises a first set of transistors having a first conductance parameter and a second set of transistors having a second conductance parameter, and wherein the voltage generator further comprises means for compensating for uncontrolled variations in said reference voltage caused by variations between said first conductance parameter and said second conductance parameter.

8. The voltage generator of claim 7, wherein said first set of transistors are N-channel MOS transistors and said second set of transistors are P-channel MOS transistors.

9. A voltage generation method, for producing a reference voltage, comprising the steps of:
- (a) cascading a first and a second voltage generator circuit, said first voltage generator circuit comprising a first set of circuit elements and said second voltage generator circuit comprising a second set of circuit elements;

at least one of said sets of circuit elements includes a first set of temperature sensitive circuit elements and at least one of said sets of circuit elements includes a second set of temperature sensitive circuit elements, wherein changes in temperature cause variations in conductance of said temperature sensitive circuit elements, and wherein temperature-caused changes in conductance of said first set of temperature sensitive circuit elements induce variations in said reference voltage;

(b) obtaining said reference voltage at an output terminal of one of said voltage generator circuits; and (c) preventing temperature-caused changes in conductance of said second set of temperature sensitive circuit elements from negating variations in said reference voltage with temperature.

10. The voltage generation method of claim 9, wherein each of said sets of circuit elements comprises a first set of transistors having a first conductance parameter and a second set of transistors having a second conductance parameter, further comprising the step of compensating for uncontrolled variations in said reference voltage caused by variations between said first conductance parameter and said second conductance parameter.

11. A voltage generator, used to produce a reference voltage that varies with noise conditions, comprising:

(a) a first voltage generator circuit producing an output voltage;

(b) a second voltage generator circuit producing said reference voltage, wherein said second voltage generator is coupled to said first voltage generator to receive said output voltage;

(c) wherein each of said voltage generator circuits comprises:

a first set of transistors having a first conductance parameter, and a second set of transistors having a second conductance parameter; and (d) a feedback path coupled to said first and second voltage generator circuits, wherein said feedback path compensates for uncontrolled variations in said reference voltage caused by variations between said first conductance parameter and said second conductance parameter.

12. The voltage generator of claim 11, wherein said voltage generator further comprises a floating voltage source connected to at least one of said first voltage generator circuit and said second voltage generator circuit, said floating voltage source having a temperature coefficient that enables said floating voltage source to increase the voltage generator's temperature dependence in a controlled fashion.

13. A voltage generator for producing a reference voltage comprising:

(a) a first voltage generator circuit having a first set of circuit elements;

(b) a second voltage generator circuit having a second set of circuit elements;

(c) wherein at least one of said first and second sets of circuit elements includes a first set of temperature sensitive circuit elements and at least one of said first and second sets of circuit elements includes a second set of temperature sensitive circuit elements, wherein changes in temperature cause variations in conductance of said temperature sensitive circuit elements, and wherein temperature-caused changes in conductance of said first set of temperature sensitive circuit elements induce variations in said reference voltage;

(d) a cascading circuit connected to said first voltage generator circuit and said second voltage generator circuit, wherein said cascading circuit cascades said first voltage generator circuit to said second voltage generator circuit;

(e) an output terminal connected to said second voltage generator circuit, wherein said reference voltage appears at said output terminal; and (f) a floating voltage source, connected to at least one of said first voltage generator circuit and said second voltage generator circuit, wherein said floating voltage source prevents temperature-caused changes in conductance of said second set of temperature sensitive circuit elements from negating variations in said reference voltage with temperature.

14. The voltage generator of claim 13, wherein each of said sets of circuit elements comprises a first set of transistors having a first conductance parameter and a second set of transistors having a second conductance parameter, and wherein the voltage generator further comprises a feedback path coupled to said first voltage generator circuit and said second voltage generator circuit to compensate for uncontrolled variations in said reference voltage caused by variations between said first conductance parameter and said second conductance parameter.

* * * * *